United States Patent
Tsai

(10) Patent No.: US 8,749,412 B1
(45) Date of Patent: Jun. 10, 2014

(54) ANTI-NOISE SUCCESSIVE APPROXIMATION ANALOG TO DIGITAL CONVERSION METHOD

(71) Applicant: Jin-Shy Tsai, Hsinchu (TW)

(72) Inventor: Jin-Shy Tsai, Hsinchu (TW)

(\*) Notice: Subject to any disclaimer, the term of this patent is extended or adjusted under 35 U.S.C. 154(b) by 0 days.

(21) Appl. No.: 13/786,471

(22) Filed: Mar. 6, 2013

(51) Int. Cl.
*H03M 1/06* (2006.01)

(52) U.S. Cl.
USPC ........................... 341/118; 341/120

(58) Field of Classification Search
CPC .................................. H03M 1/00; H03M 1/12
USPC ............................ 341/118, 120, 155, 156, 122
See application file for complete search history.

(56) References Cited

U.S. PATENT DOCUMENTS 6,184,809 B1 \* 2/2001 Yu .................................. 341/120

\* cited by examiner

*Primary Examiner* — Joseph Lauture

(57) ABSTRACT

An anti-noise successive approximation analog to digital conversion method is provided with the steps of instructing a comparison control circuit to perform a predetermined number of extra comparison cycles in a plurality of valid bit cycles and outputting a plurality of digital signals wherein no digital to analog feedback is perform; instructing a digital error correction circuit to correct any digital signals having erroneous bits due to noise interference in the outputted digital signals and output a bit or byte as a result of the correction, the bit or byte being defined as a noise free digital output bit or byte; and performing a successive approximation analog to digital conversion based on the digital output bit or byte if there are any subsequent bit cycles.

6 Claims, 12 Drawing Sheets

ANTI-NOISE SUCCESSIVE APPROXIMATION ANALOG TO DIGITAL CONVERSION METHOD

BACKGROUND OF THE INVENTION

1. Field of the Invention

The invention relates to analog to digital conversion and more particularly to an anti-noise successive approximation analog to digital conversion method.

2. Description of Related Art

There are many different analog-to-digital converters (ADCs) available. For example, there are flash ADCs, pipelined ADCs, and successive approximation register (SAR) ADCs. Each of them has respective advantages and they are used depending on applications. The SAR ADCs have benefits of consuming less energy, occupying less space, and more cost effective as compared with the flash ADCs and pipelined ADCs.

Typically, SAR ADC employs a binary search algorithm to obtain digital output codes which match input codes. An analog-to-digital conversion circuit of the SAR ADC may add or subtract a binary voltage based on result of each comparison done by a comparator during the conversion. A difference of input signal and reference voltage will be less than a least significant bit (LSB) after the last bit cycle. But noise from the circuit may distort the conversion.

For increasing the noise reduction capability of an SAR ADC, it is typical to design the SAR ADC to be one with very low noise generation. However, it can greatly increase the manufacturing cost of the circuit as well as large area and high energy consumption. There are several known methods which allow higher noise levels in bit cycles of an SAR ADC. These methods employ an error compensation to allow settling error. However, they do not solve the noise problem completely because several last bit conversions without fault tolerant capability are still subject to noise. As a result, the conversion is still distorted.

Thus, the need for improvement still exists.

SUMMARY OF THE INVENTION

It is therefore one object of the invention to provide an anti-noise successive approximation analog to digital conversion method comprising the steps of instructing a comparison control circuit to perform a predetermined number of extra comparison cycles in a plurality of valid bit cycles and outputting a plurality of digital signals wherein no digital to analog feedback is perform; instructing a digital error correction circuit to correct any digital signals having erroneous bits due to noise interference in the outputted digital signals and output a bit or byte as a result of the correction, the bit or byte being defined as a noise free digital output bit or byte; and performing a successive approximation analog to digital conversion based on the digital output bit or byte if there are any subsequent bit cycles.

The above and other objects, features and advantages of the invention will become apparent from the following detailed description taken with the accompanying drawings.

DETAILED DESCRIPTION OF THE INVENTION

Figure 6:
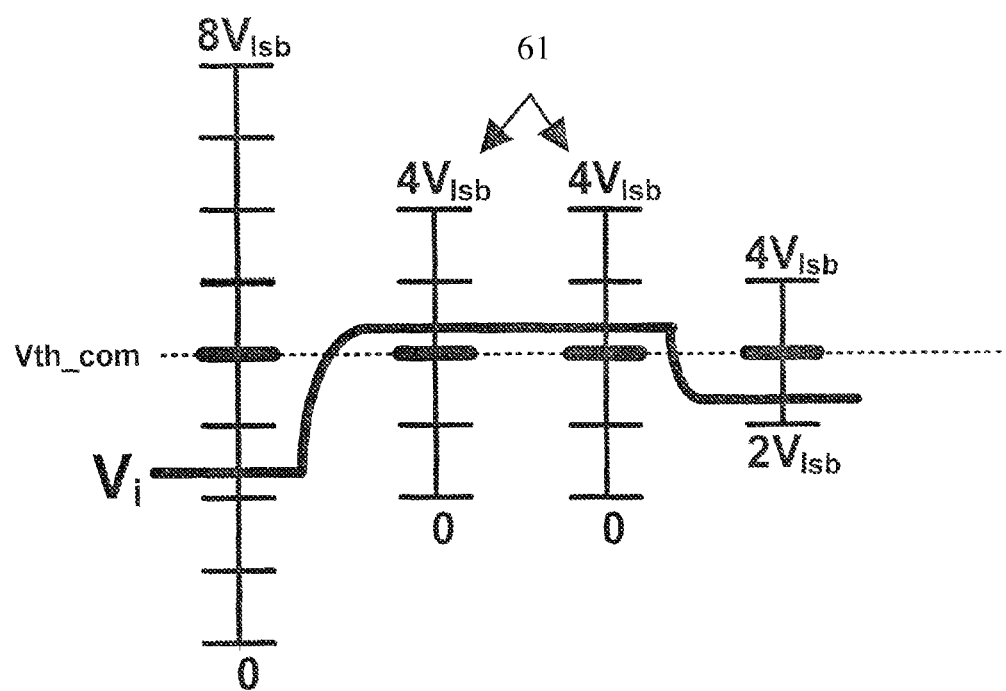
FIG. 6 is a graph showing operations of the apparatus in a fourth preferred embodiment.
Figure 7:
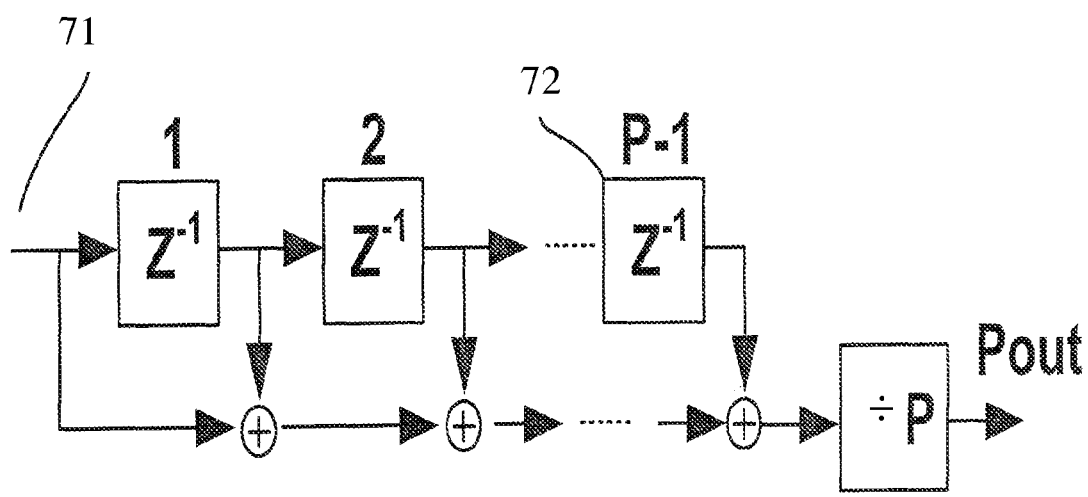
FIG. 7 is a circuit block diagram of a digital error correction circuit of the apparatus.
Figure 8:
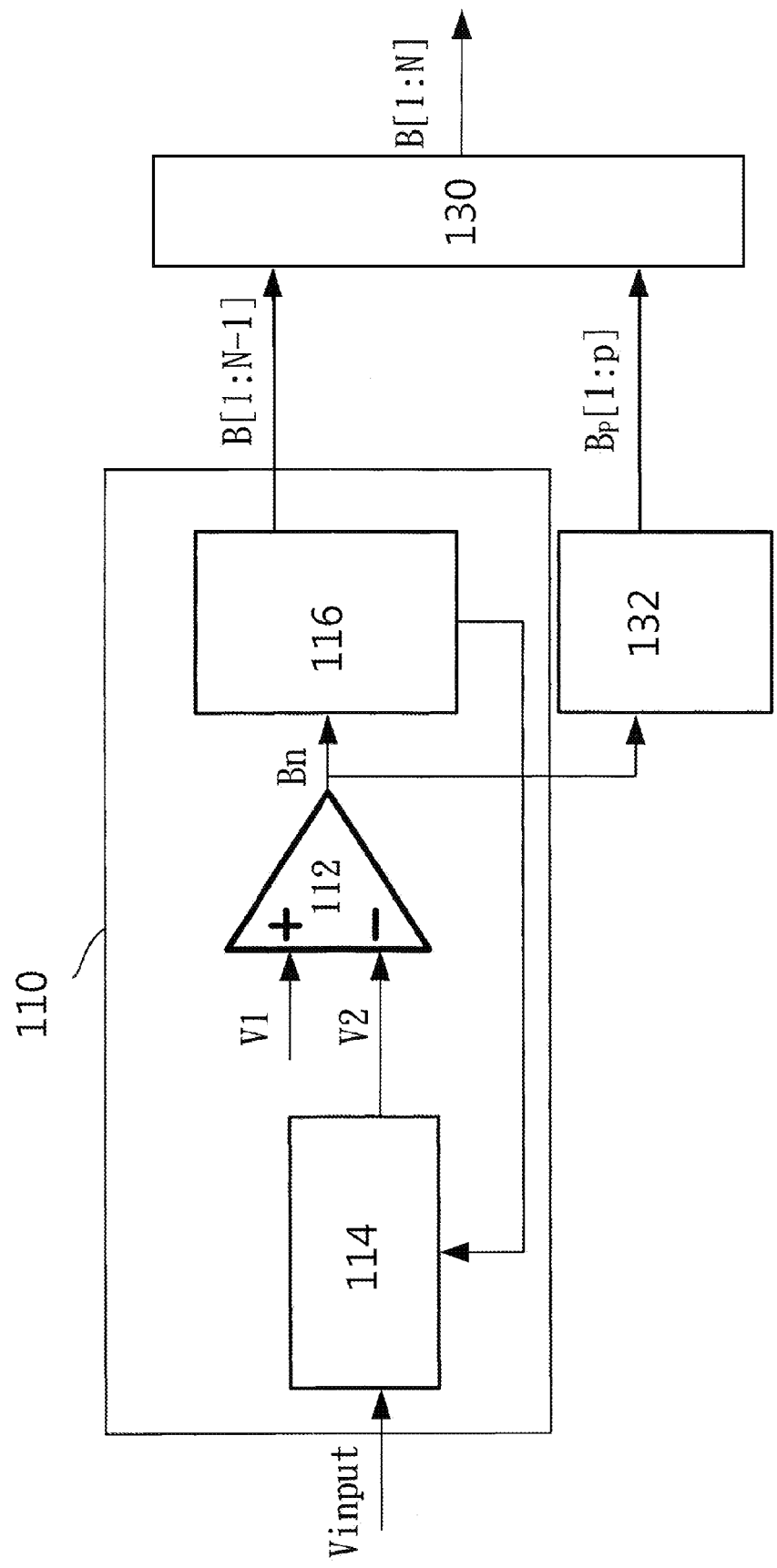
FIG. 8 is a circuit block diagram of an analog-to-digital conversion device of each of the first, second and third preferred embodiments of the apparatus.

Referring to FIGS. 1 to 9, an anti-noise successive approximation analog to digital conversion apparatus in accordance with the invention comprises a successive approximation analog-to-digital converter (SAR ADC) 110, a digital error correction circuit 130, and a comparison control circuit 132. The SAR ADC 110 is one of available successive approximation analog to digital conversion devices and comprises a first comparator 112, an analog-to-digital converter (ADC) 114, and a successively approaching control circuit 116. The first comparator 112 comprises a first input V1 for receiving a first analog signal, a second input V2 for receiving a second analog signal, and an output Bn. The ADC 114 is electrically connected to the second input V2. The successively approaching control circuit 116 is electrically connected to a control of the ADC 114 and an output Bn of the first comparator 112 as shown in FIG. 8.

Figure 1:
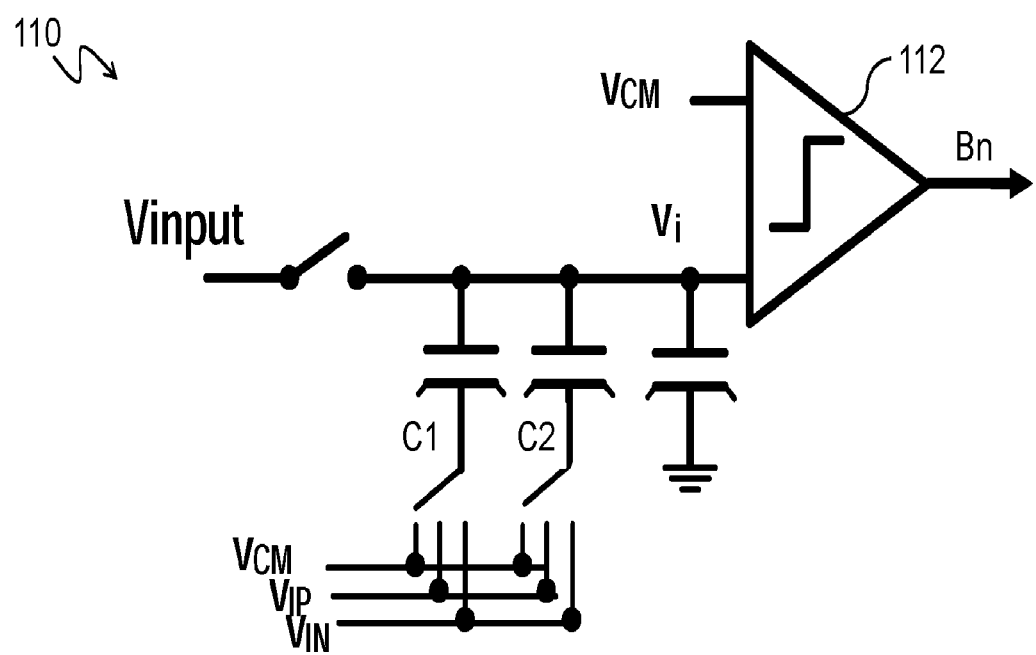
FIG. 1 is a circuit diagram of an anti-noise successive approximation analog to digital conversion apparatus according to the invention.

As shown in FIG. 1, a three-bit SAR ADC 110 having a single input is discussed below. The SAR ADC 110 comprises a common mode voltage $V_{CM}$, an input voltage $V_{IN}$, a positive reference voltage $V_{IP}$ a negative reference voltage $V_{IN}$, and first and second capacitors C1, C2 which are to be turned off/on switching among $V_{IN}$, $V_1$ and $V_{CM}$ during search in a digital-to-analog converter (DAC) of the SAR ADC 110.

Figure 2:
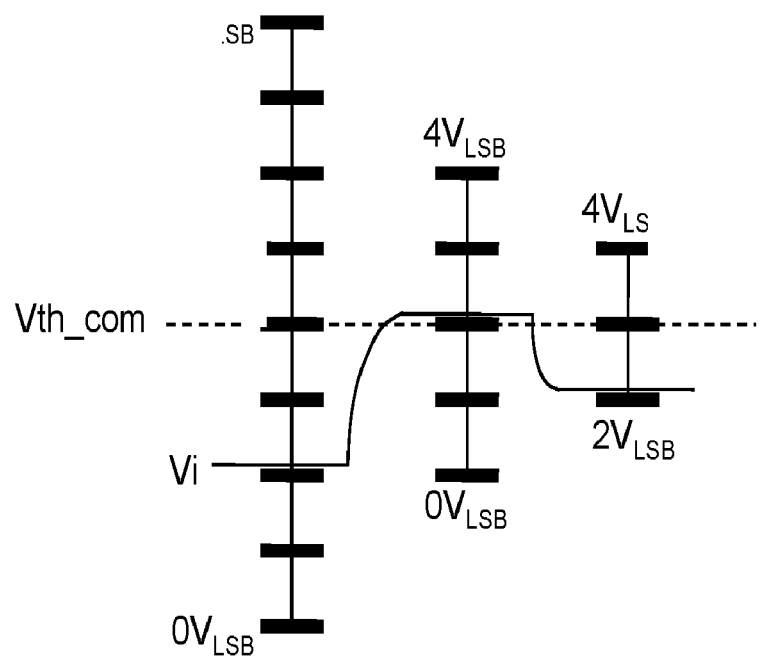
FIG. 2 is a graph showing first operations of the apparatus in a first preferred embodiment.

As shown in FIG. 2, a conversion of the input voltage V1 is discussed below. Eight sections to the left represent eight quantization levels of the three-bit SAR ADC 110, and an intermediate dotted line represents a comparison level Vth_com indicating whether bit of the comparator 112 is logic 1 or 0 during search performed by the SAR ADC 110. Output bit Bn of the comparator 112 is 0 if the input voltage V1 is less than the comparison level Vth_com of the comparator 112. To the contrary, output bit Bn of the comparator 112 is 1 if the input voltage V1 is greater than the comparison level Vth_com of the comparator 112. For Bn, n is 1, 2, or 3. That is, n is an integer corresponding to a positive integer of the bits of the SAR ADC 110. Transient waveform of the input voltage V1 is shown as a curve during the search performed by the SAR ADC 110. $V_{SB}$ represents a voltage increment of a least significant bit (LSB).

B[1:3] represent a digital output signal of the input voltage V1 after being converted by the SAR ADC 110. In detail, [B1,B2,B3]=[0,1,0] where B1 represents a most significant bit (MSB) and B3 represents a LSB. A correct output signal can be obtained without any interference by noise.

Figure 3:
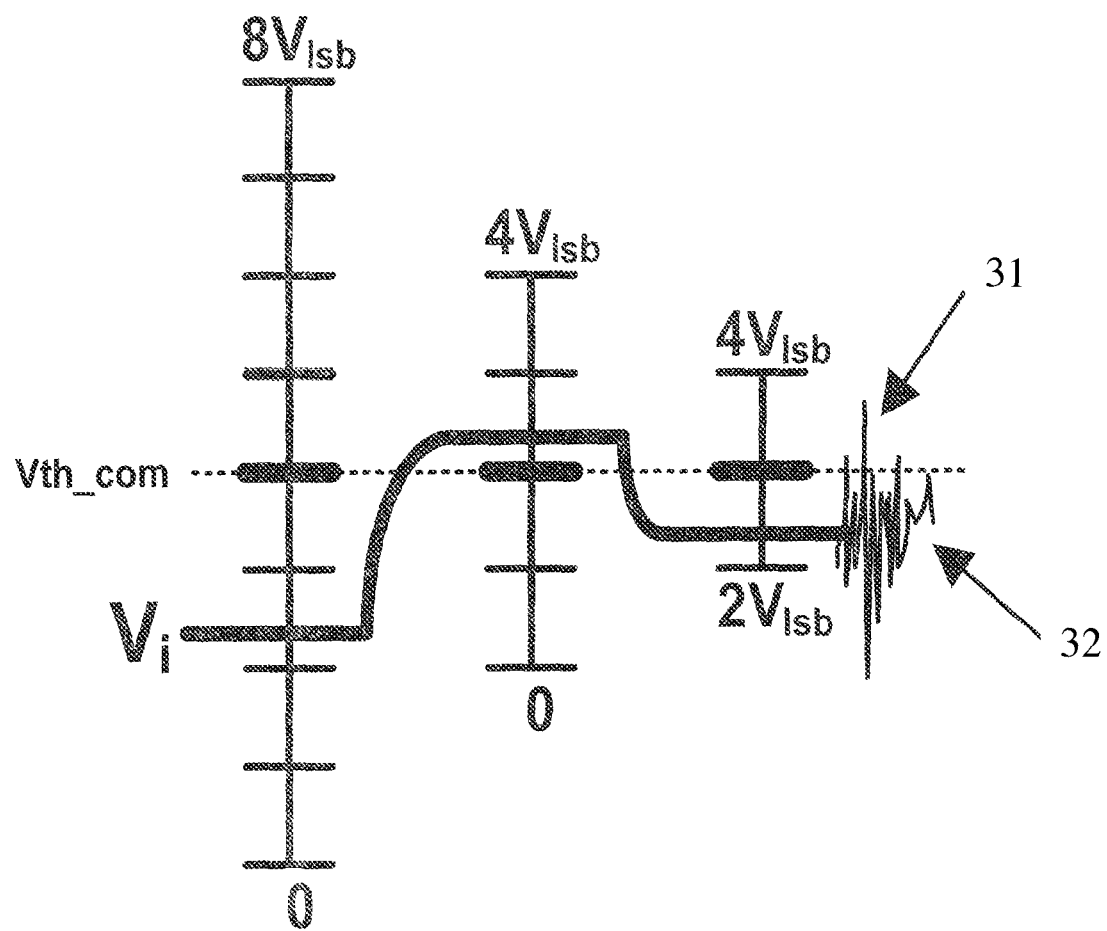
FIG. 3 is a graph showing second operations of the apparatus in the first preferred embodiment.

In FIG. 3, a transient waveform of the input voltage V1 being interfered by noise 32 during the search performed by the SAR ADC 110 is shown. The input analog value 31 of the interfered comparator has certain probability of being greater than Vth_com of the comparator due to the existence of noise in the circuit. Therefore, an incorrect digital output may be obtained due to incorrect comparison result. As shown, an incorrect B3=1 rather than a correct B3=0 is obtained.

In the anti-noise successive approximation analog to digital conversion apparatus of the invention, in a certain bit cycle (e.g., the last bit cycle) additional P comparison cycles are initiated. The comparator 112 compares the input voltage V1 with the comparison level Vth_com thereof and a digital filter is performed on an output digital code Bp[1:p]=[P1, P2, . . . , Pp]. In an exemplary example, P1 to Pp are added together to obtain a sum which is divided by P. A result is an output of a single digital bit Pout. Alternatively, a check of P1 to Pp having more logic 1 or 0 is performed. Output Pout is a logic level of the majority. The output Pout of the digital error correction logic combines with logic of the original bit and a final digital output signal [B1, B2, Pout]=[0,1.0] is obtained. In other words, if an input signal of the comparator 112 has a level slightly lower or higher than the comparison level Vth_com (note that the slightly lower or higher means a difference of the input and the comparison level Vth_com is less than a quantified level of LSB), a correct output bit Pout can be obtained by performing a plurality of comparisons, choosing a majority, and eliminating the interference of noise. In this embodiment, Pout=0. Some bits in P1 to Pp may output incorrect 1 due to noise interference. But the majority of bits in P1 to Pp may output correct 0 if the number of cycles is sufficiently large (i.e., correct output 0 having a greater probability than erroneous output 1). Note that Pn means added bits or extra comparison cycle output bits not output bits Bn of the comparator 112.

Figure 4:
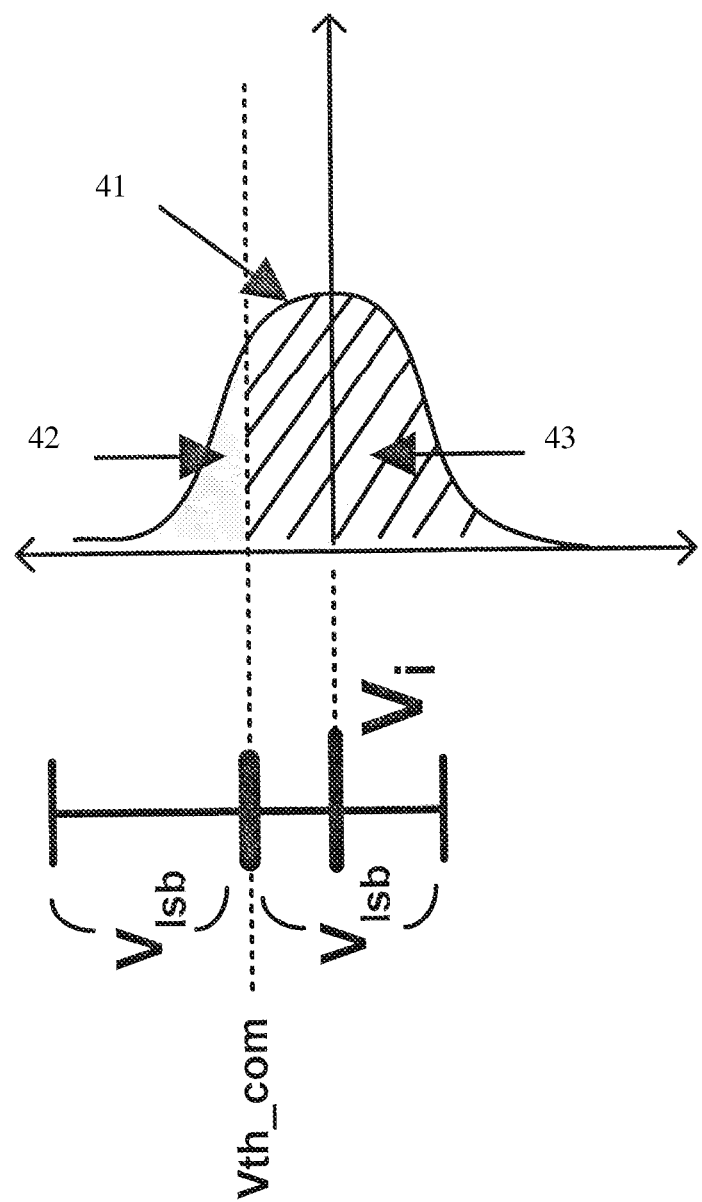
FIG. 4 is a graph showing operations of the apparatus in a second preferred embodiment.
Figure 5:
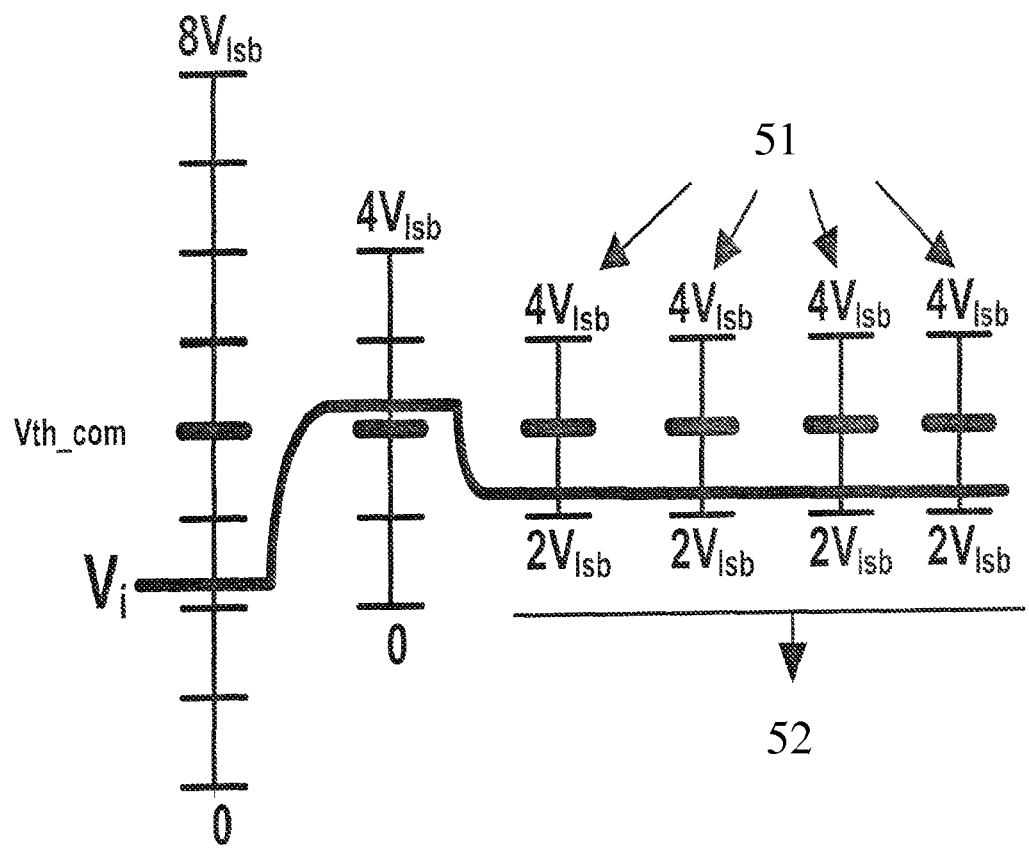
FIG. 5 is a graph showing operations of the apparatus in a third preferred embodiment.

In FIG. 4, a graph depicting probability distribution of correct logic output and incorrect logic output under noise interference is shown. Reference numeral "41" is a function of probability density distribution under noise interference. As described above, output logic is correct if Vi is less than Vth_com. Probability of the comparator having an output of "0" is denoted by area 43. Probability of the comparator having an output of "1" is denoted by area 42. Specifically, probability of the comparator having an output of "0" and probability of the comparator having an output of "1" represent a difference between Vth_com and the current Vi in terms of magnitude and direction. Further, in the anti-noise successive approximation analog to digital conversion apparatus of the invention, it is possible of quantifying values of significant bits by employing probability of the comparator having an output of "0" and probability of the comparator having an output of "1". As shown in FIG. 4, ratio of probability of the comparator having an output of "0" and probability of the comparator having an output of "1" is 84% to 16%. This can be obtained by calculating the ratio of output "0"s to output "1"s after many times of extra comparison. This value corresponds to a difference of Vth_com above Vi with a magnitude of a standard deviation of noise based on probability distribution of noise (e.g., Gauss normal distribution). In this example, output bite 01 represents bit value 0 of this significant bit cycle and bit value 1 of the next bit cycle after this significant bit cycle respectively based on the corresponding magnitude profile of Gauss noise distribution with respect to a LSB. The digital error correction circuit 130 employs a lookup table to look all possible combinations of logic 0 and logic 1 in extra comparison cycles. A one-to-one mapped correct output of significant logic bite is obtained. This completes an analog to digital quantified conversion which is also immune to noise.

In the anti-noise successive approximation analog to digital conversion apparatus of the invention, extra comparison cycles can be added to any bit cycles. In the embodiment shown in FIG. 5, valid extra bit cycles 51 are combined into a significant bit cycle 52, i.e., added to the last bit cycle. A transient waveform of input voltage V1 during the search performed by the SAR ADC 110 is shown. In this condition, the input voltage V1 is converted by a normal SAR ADC 110. A digital output signal [B1,B2,B3]=[0,1,0] is generated. Note that, with noise interference, another incorrect digital output signal pattern [B1,B2,B3]=[0,1,1] is also a possible output. Four comparison cycles are added to decrease noise interference and errors in response to noise interference. In this cycle of output digital code Bp[1:4]=[P1,P2,P3,P4], there are eight possible events. The digital error correction circuit 130 will detect a majority of P1 to P4 having logic 1 or 0. Output Pout is a logic level of the majority. Output Pout of the digital error correction circuit 130 combines with the original bit logics B1, B2. As a result, a noise-free digital output signal [B1,B2, Pout]=[0,1,0] is generated.

In the anti-noise successive approximation analog to digital conversion apparatus of the invention, comparison cycles 61 can be performed in any bit cycles. As shown in FIG. 6, the input voltage V1 of the comparator 112 has a level almost the same as that of the comparison level Vth_com of the comparator 112 in the second bit cycle. The correct output of the second output bit B2 after the comparison should be 1. However, the real output of the second output bit B2 after the comparison is an incorrect 0, i.e., B2=0, due to the noise interference. But it is preferred to subject this bit cycle to a comparison cycle. After subjecting this bit cycle to the comparison cycle, a correct digital output signal [B1,Pout,B3]= [0,1,0] is obtained. Noise interference has been eliminated since a great number of samplings are performed on Pout with a majority of sampling results being adopted. As such, noise is prevented from adversely affecting the accuracy of the conversion done by the ADC. Further, a feedback from digital to analog is continuously performed based on Pout since the bits of the added comparison cycle are not the last bits. As a result, the successive approximation analog to digital conversion can be finished.

In the anti-noise successive approximation analog to digital conversion apparatus of the invention, comparison cycles can be any positive integers. A square of a positive integer of 2 is preferred. For example, $4=2^2$ is implemented in FIG. 5, and $2=2^1$ is implemented in FIG. 6. The digital error correction circuit 130 will perform a filtering to eliminate the noise in response. As a result, a single noise-free digital output logic bit is outputted as a bit value of this significant bit cycle.

As shown in FIG. 7, the digital error correction circuit 130 employs P-1 flip-flops 72 as shift registers for storing comparator outputs of P comparison cycles of a bit cycle with respect to comparator output 71 cycle of redundant P bit cycles. All outputs are added together and are in turn divided by P by a divisor. An output Pout is obtained with no noise. The output Pout is defined as bit code of this bit cycle. The divisor circuit can be implemented by a shift register if P can be expressed by $2^n$ where n is a positive integer.

As shown in FIG. 8, the anti-noise successive approximation analog to digital conversion apparatus of the invention comprises an SAR ADC 110, a digital error correction circuit 130, and a comparison control circuit 132. The SAR ADC 110 comprises a first comparator 112, an ADC 114, and a successively approaching control circuit 116.

A first input of the first comparator 112 is adapted to receive a first analog signal. A second input V2 of the first comparator 112 is electrically connected to an output of the ADC 114 and is adapted to receive a signal (e.g., a second analog signal V2) from the output of the ADC 114. The successively approaching control circuit 116 is electrically connected to a control of the ADC 114 and an output of the first comparator 112. The comparison control circuit 132 receives signals from an output of the first comparator 112 and sends the signals to the digital error correction circuit 130.

Further, in FIG. 8, the SAR ADC 110 performs a successive approximation algorithm to control an output of the ADC 114. In the embodiment, the ADC 114 is under the control of the successively approaching control circuit 116 and in cooperation with an analog input signal $V_{input}$, a common mode voltage $V_{CM}$, a positive reference voltage $V_{IP}$, and a negative reference voltage $V_{IN}$ for outputting a second analog signal V2. The first analog signal V1 is a common mode voltage $V_{CM}$ and the second analog signal V2 is an input voltage $V_{input}$. In the embodiment, the ADC 114 comprises a switch matrix including a plurality of capacitor matrices and coupling capacitor matrices having a plurality of bits from the MSB to the LSB. The successively approaching control circuit 116 employs the switch matrix to sequentially adjust voltage levels of a predetermined number of bits so that the ADC 114 can supply second analog signals V2.

The comparison control circuit 132 activates the comparator 112 to perform p redundant cycle comparisons, receives comparison results (e.g., a series of digital output signals Bp[1:p]) from the first comparator 112, and send the comparison results to the digital error correction circuit 130. The digital error correction circuit 130 can eliminate noise and output a digital bit which is combined with an output signal from other bit cycles to generate a final analog to digital conversion result. The successive approximation algorithm is a binary search algorithm. Alternatively, it can be a sub-binary search algorithm. Still alternatively, it can be a fault tolerant binary search algorithm containing repetitive digital to analog feedbacks.

Figure 9:
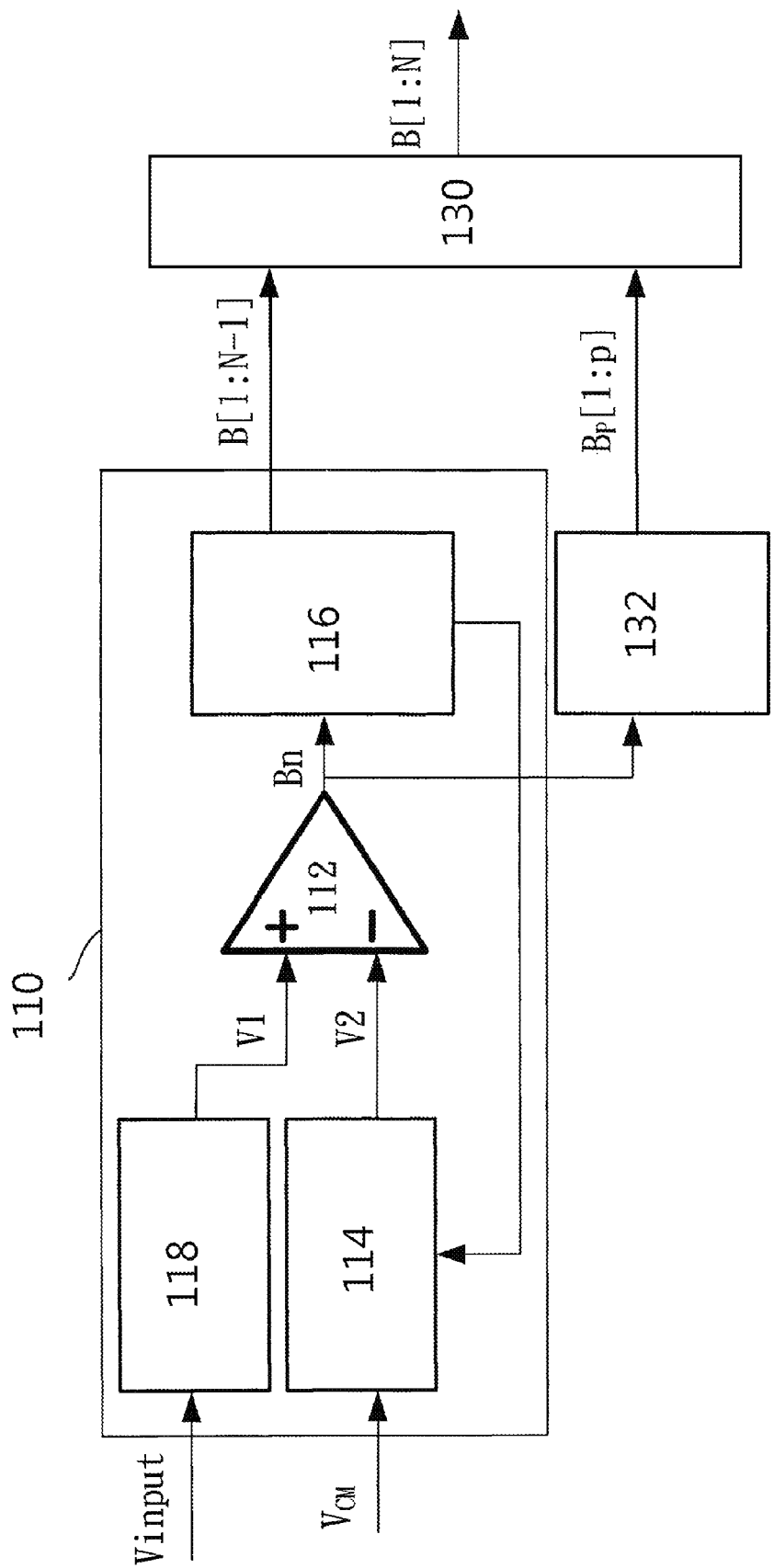
FIG. 9 is a circuit block diagram of an analog-to-digital conversion device of the fourth preferred embodiment of the apparatus.

As shown in FIG. 9, the SAR ADC 110 employs anti-noise technologies. In the embodiment, the ADC 114 is under the control of the successively approaching control circuit 116 and in cooperation with a common mode voltage $V_{CM}$, a positive reference voltage $V_{IP}$, and a negative reference voltage $V_{IN}$ for outputting a second analog signal V2. A sample-and-hold circuit 118 is under the control of the successively approaching control circuit 116 to perform a sampling maintaining on the analog input signal $V_{input}$. As a result, a first analog signal V1 is generated. The first analog signal V1 is an input voltage V1 and the second analog signal V2 corresponds to the common mode voltage $V_{CM}$.

Figure 10:
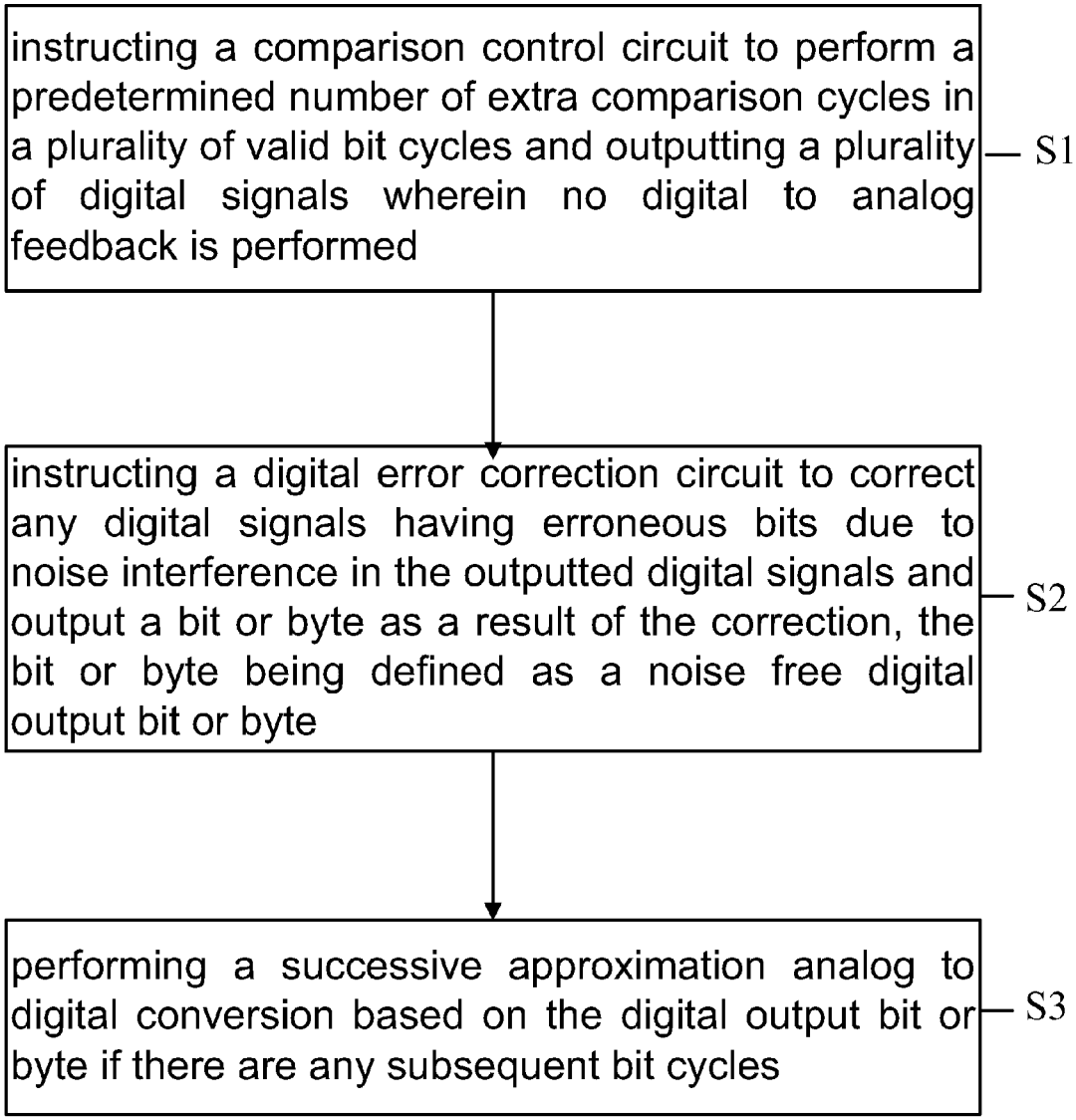
FIG. 10 is a flow chart of an anti-noise successive approximation analog to digital conversion method according to a first preferred embodiment of the invention.

Referring to FIG. 10, an anti-noise successive approximation analog to digital conversion method according to a first preferred embodiment of the invention implemented in the anti-noise successive approximation analog to digital conversion apparatus is illustrated and comprises step S1 of instructing a comparison control circuit to perform a predetermined number of extra comparison cycles in a plurality of valid bit cycles and outputting a plurality of digital signals wherein no digital to analog feedback is performed; step S2 of instructing a digital error correction circuit to correct any digital signals having erroneous bits due to noise interference in the outputted digital signals and output a bit or byte as a result of the correction, the bit or byte being defined as a noise free digital output bit or byte; and step S3 of performing a successive approximation analog to digital conversion based on the digital output bit or byte if there are any subsequent bit cycles.

Preferably, wherein step S2 comprises the sub-steps of determining a majority of logic values 0 and 1 of the comparisons; outputting a logic value 0 or 1 based on the determined majority or outputting logic bite based on the corresponding magnitude mapping from the probability distribution of noise; and defining the logic value as a quantified correct output bit or byte.

Preferably, the valid bit cycles comprise a least significant bit (LSB) cycle which is the last bit cycle.

Preferably, the predetermined number of extra comparison cycles is a square of a positive integer of 2.

Figure 11:
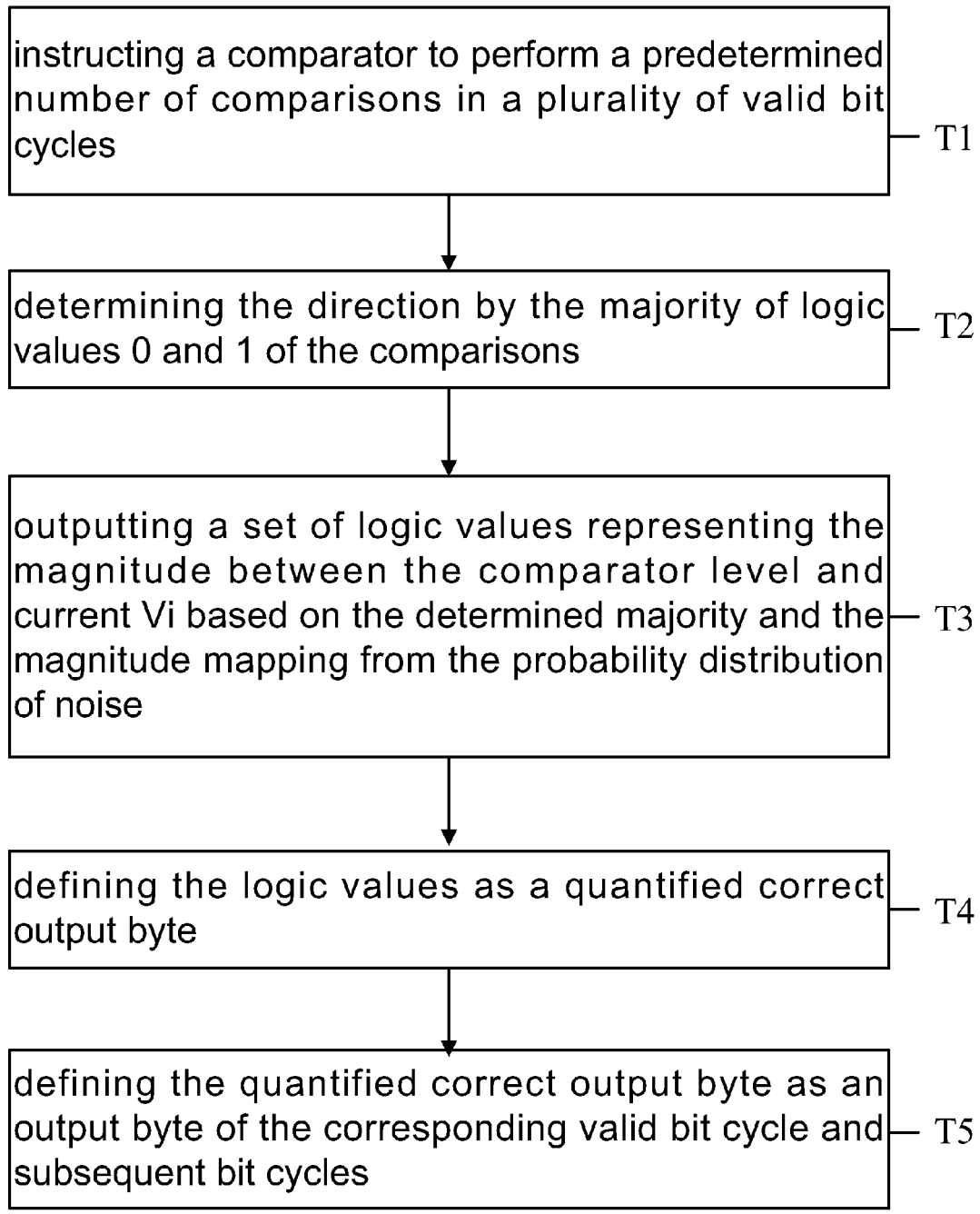
FIG. 11 is a flow chart of an anti-noise successive approximation analog to digital conversion method according to a second preferred embodiment of the invention.

Referring to FIG. 11, An anti-noise successive approximation analog to digital conversion method according to a second preferred embodiment of the invention implemented in the anti-noise successive approximation analog to digital conversion apparatus is illustrated and comprises the step T1 of instructing a comparator to perform a predetermined number of comparisons in a plurality of valid bit cycles; step T2 of determining the direction by the majority of logic values 0 and 1 of the comparisons; step T3 of outputting a set of logic values representing the magnitude between the comparator level and current Vi based on the determined majority and the magnitude mapping from the probability distribution of noise; step T4 of defining the logic values as a quantified correct output byte; and step T5 of defining the quantified correct output byte as an output byte of the corresponding valid bit cycle and subsequent bit cycles.

Figure 12:
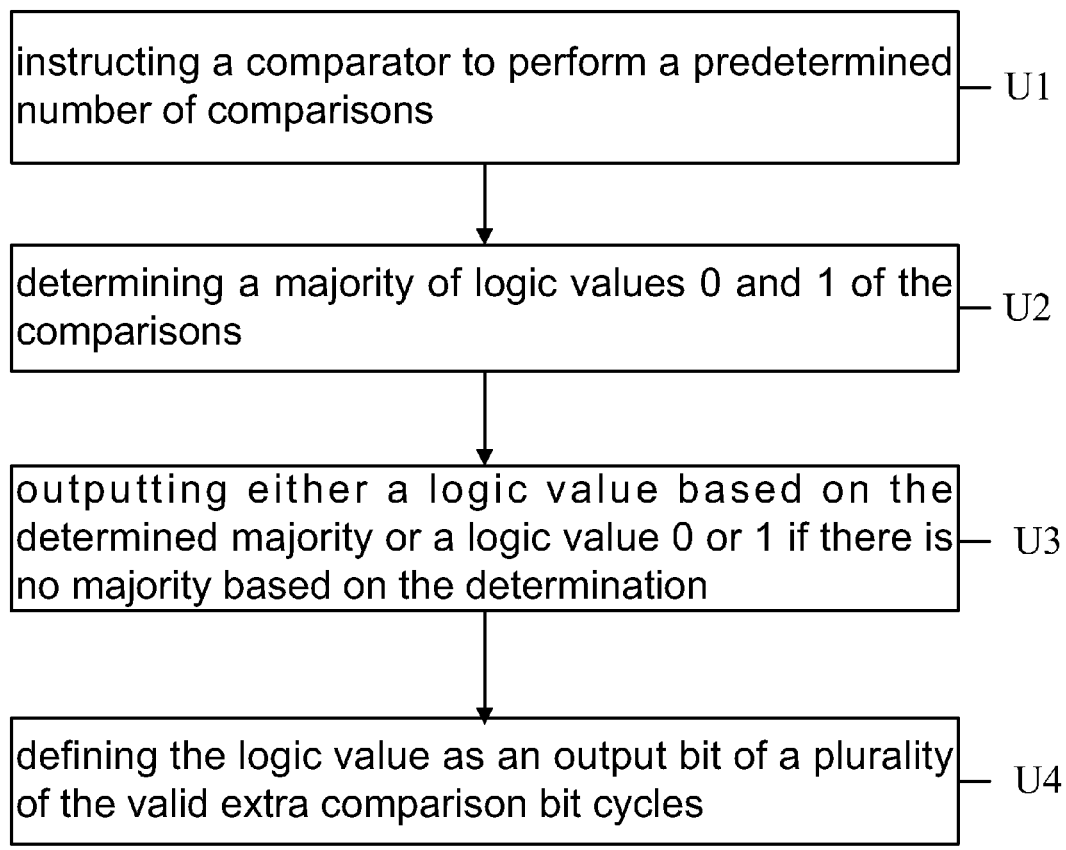
FIG. 12 is a flow chart of an anti-noise successive approximation analog to digital conversion method according to a third preferred embodiment of the invention.

Referring to FIG. 12, An anti-noise successive approximation analog to digital conversion method according to a third preferred embodiment of the invention implemented in the anti-noise successive approximation analog to digital conversion apparatus is illustrated and comprises step U1 of instructing a comparator to perform a predetermined number of comparisons; step U2 of determining a majority of logic values 0 and 1 of the comparisons; step U3 of outputting either a logic value based on the determined majority or a logic value 0 or 1 if there is no majority based on the determination; and step U4 of defining the logic value as an output bit of a plurality of the valid extra comparison bit cycles.

It is envisaged by the invention that the anti-noise successive approximation analog to digital conversion method can perform a successive approximation analog to digital conversion with the reduction of noise. This is a great improvement in comparison with the method implemented by the conventional SAR ADC.

While the invention has been described in terms of preferred embodiments, those skilled in the art will recognize that the invention can be practiced with modifications within the spirit and scope of the appended claims.

What is claimed is:

1. An anti-noise successive approximation analog to digital conversion method comprising the steps of:
   (a) instructing a comparison control circuit to perform a predetermined number of extra comparison cycles in a plurality of valid bit cycles and outputting a plurality of digital signals wherein no digital to analog feedback is perform;
   (b) instructing a digital error correction circuit to correct any digital signals having erroneous bits due to noise interference in the outputted digital signals and output a bit or byte as a result of the correction, the bit or byte being defined as a noise free digital output bit or byte; and (c) performing a successive approximation analog to digital conversion based on the digital output bit or byte if there are any subsequent bit cycles.

2. The anti-noise successive approximation analog to digital conversion method of claim 1, wherein step (b) comprises the sub-steps of:

determining a majority of logic values 0 and 1 of the comparisons;

outputting either a logic value based on the determined majority or a logic value 0 or 1 if there is no majority based on the determination;

or outputting a set of logic values on the determined majority and the magnitude mapping from the probability distribution of noise; and defining the logic value as a quantified correct output bit or byte.

3. The anti-noise successive approximation analog to digital conversion method of claim 1, wherein the valid extra comparison bit cycles comprise a least significant bit (LSB) cycle which is the last bit cycle.

4. The anti-noise successive approximation analog to digital conversion method of claim 1, wherein the predetermined number of extra comparison cycles is a square of a positive integer of 2.

5. An anti-noise successive approximation analog to digital conversion method comprising the steps of:

instructing a comparator to perform a predetermined number of comparisons in a plurality of valid bit cycles;

determining a majority of logic values 0 and 1 of the comparisons;

outputting a set of logic values representing a magnitude between a comparator level and a current input voltage based on the determined majority and a magnitude mapping from probability distribution of noise;

defining the logic values as a quantified correct output byte; and defining the quantified correct output byte as an output byte of the corresponding valid bit cycle and subsequent bit cycles.

6. An anti-noise successive approximation analog to digital conversion method comprising the steps of:

instructing a comparator to perform a predetermined number of comparisons in a plurality of valid bit cycles;

outputting a logic byte based on a magnitude mapping from probability distribution of noise;

defining the logic value as a quantified correct output byte; and defining the quantified correct output byte as an output byte of the corresponding valid bit cycles and subsequent bit cycles.

* * * * *